(12) United States Patent
Cheng et al.

(10) Patent No.: US 12,713,977 B2
(45) Date of Patent: Aug. 18, 2026

(54) SEMICONDUCTOR STRUCTURE AND MANUFACTURING METHOD THEREFOR

(71) Applicant: ENKRIS SEMICONDUCTOR, INC., Suzhou (CN)

(72) Inventors: Kai Cheng, Suzhou (CN); Zhuan Liu, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 928 days.

(21) Appl. No.: 17/916,413

(22) PCT Filed: Jul. 16, 2020

(86) PCT No.: PCT/CN2020/102318

§ 371 (c)(1),
(2) Date: Sep. 30, 2022

(87) PCT Pub. No.: WO2022/011635

PCT Pub. Date: Jan. 20, 2022

(65) Prior Publication Data

US 2023/0154902 A1 May 18, 2023

(51) Int. Cl.
*H10W 90/00* (2026.01)
*H10H 20/01* (2025.01)
(Continued)

(52) U.S. Cl.
CPC ...... *H10W 90/00* (2026.01); *H10H 20/01335* (2025.01); *H10H 20/814* (2025.01);
(Continued)

(58) Field of Classification Search
CPC ........... H10H 20/01335; H10H 20/018; H10H 20/032; H10H 20/812; H10H 20/814;
(Continued)

(56) References Cited

U.S. PATENT DOCUMENTS

2010/0062551 A1* 3/2010 Chen ................ H10H 20/01335 438/23
2013/0049036 A1* 2/2013 Jeong ................ H10H 20/8314 257/91

(Continued)

FOREIGN PATENT DOCUMENTS

CN 102130238 A 7/2011
CN 102810550 A 12/2012

(Continued)

OTHER PUBLICATIONS

State Intellectual Property Office of the People's Republic of China, Office Action and Search Report Issued in Application No. 202080102500X, Nov. 28, 2024, 8 pages. (Submitted with Machine Translation).

(Continued)

*Primary Examiner* — Matthew C Landau
*Assistant Examiner* — Dmitriy Yemelyanov
(74) *Attorney, Agent, or Firm* — BSJ & SUN LLC

(57) ABSTRACT

The present disclosure provides a semiconductor structure and a manufacturing method therefor. In the method, for the substrate, the first conductive type semiconductor layer, the light emitting layer and the second conductive type semiconductor layer distributed sequentially from bottom to top, the second conductive type semiconductor layer, the light emitting layer and the first conductive type semiconductor layer in first predetermined regions are removed to form grooves. The second conductive type semiconductor layer, the light emitting layer and the first conductive type semiconductor layer in second predetermined regions and third predetermined regions are retained. Layers retained in second predetermined regions form light emitting units arranged in an array. Various layers retained in third predetermined regions form connection posts, each of which connects adjacent light emitting units. Widths of the third (Continued)

predetermined region are smaller than widths of the second predetermined region in the lateral and longitudinal direction of the array.

10 Claims, 13 Drawing Sheets

(51) Int. Cl.
*H10H 20/814* (2025.01)
*H10H 20/825* (2025.01)
*H10H 20/831* (2025.01)
*H10H 20/857* (2025.01)

(52) U.S. Cl.
CPC ...... *H10H 20/825* (2025.01); *H10H 20/8312* (2025.01); *H10H 20/857* (2025.01); *H10H 20/032* (2025.01)

(58) Field of Classification Search
CPC .. H10H 20/816; H10H 20/825; H10H 20/831; H10H 20/8312; H10H 20/835; H10H 20/84; H10H 20/857; H01L 25/0753
See application file for complete search history.

(56) References Cited

U.S. PATENT DOCUMENTS

2016/0240732 A1 8/2016 Huang et al.
2020/0020825 A1* 1/2020 Yang .................... H10H 20/825

FOREIGN PATENT DOCUMENTS

CN 106463596 A 2/2017
CN 106663721 A 5/2017
CN 109671822 A 4/2019
JP 2014090011 A 5/2014
KR 20120104705 A 9/2012
TW 202023064 A 6/2020
WO WO-2015174924 A1 * 11/2015 ............ H10H 20/82
WO 2018101573 A1 6/2018

OTHER PUBLICATIONS

ISA State Intellectual Property Office of the People's Republic of China, International Search Report Issued in Application No. PCT/CN2020/102318, Mar. 30, 2021, WIPO, 4 pages.
ISA State Intellectual Property Office of the People's Republic of China, Written Opinion of the International Searching Authority Issued in Application No. PCT/CN2020/102318, Mar. 30, 2021, WIPO, 4 pages. (Submitted with Machine/Partial Translation).
TW Patent Office, Office Action Issued in Application No. 110125227, Sep. 8, 2022, 12 pages.(Submitted with Machine/Partial Translation).
Young-Geun Park et al "High-resolution, reconfigurable printing of liquid metals with three-dimensional structures" Science Advances, vol. 5, eaaw2844, Jun. 21, 2019. https://doi.org/10.1126/sciadv.aaw2844 Jun. 21, 2019, 10 pages.
E. Xie et al, "High-Speed Visible Light Communication Based on a III-Nitride Series-Biased Micro-LED Array," Journal of Lightwave Technology, vol. 37, pp. 1180-1186, Feb. 15, 2019. https://doi.org/10.1109/JLT.2018.2889380 Feb. 15, 2019, 7 pages.

* cited by examiner

Provide a substrate on which a first conductive type semiconductor layer, a light emitting layer and a second conductive type semiconductor layer are sequentially formed, where the first conductive type is one of a N-type and a P-type and the second conductive type is the other of the N-type and the P-type — S1

Remove the second conductive type semiconductor layer, the light emitting layer and the first conductive type semiconductor layer in first predetermined regions to form grooves, and retain the second conductive type semiconductor layer, the light emitting layer and the first conductive type semiconductor layer in second predetermined regions and third predetermined regions, where the second conductive type semiconductor layer, the light emitting layer and the first conductive type semiconductor layer in the second predetermined regions form light emitting units arranged in an array, and the second conductive type semiconductor layer, the light emitting layer and the first conductive type semiconductor layer in the third predetermined regions form connection posts, each of which connects adjacent light emitting units of the light emitting units; a width, in a lateral direction of the array, of each of the third predetermined regions is smaller than a width, in the lateral direction of the array, of each of the second predetermined regions; and a width, in a longitudinal direction of the array, of each of the third predetermined regions is smaller than a width, in the longitudinal direction of the array, of each of the second predetermined regions — S2

Remove the substrate by wet etching from the grooves, where an etching solution used in the wet etching removes the substrate at a greater rate in a horizontal plane direction than in a thickness direction — S3

FIG. 1

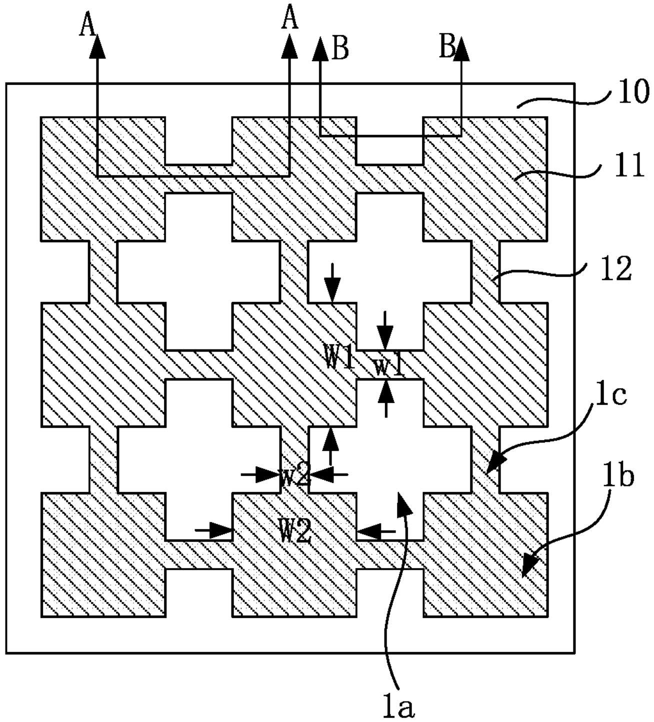

FIG. 2

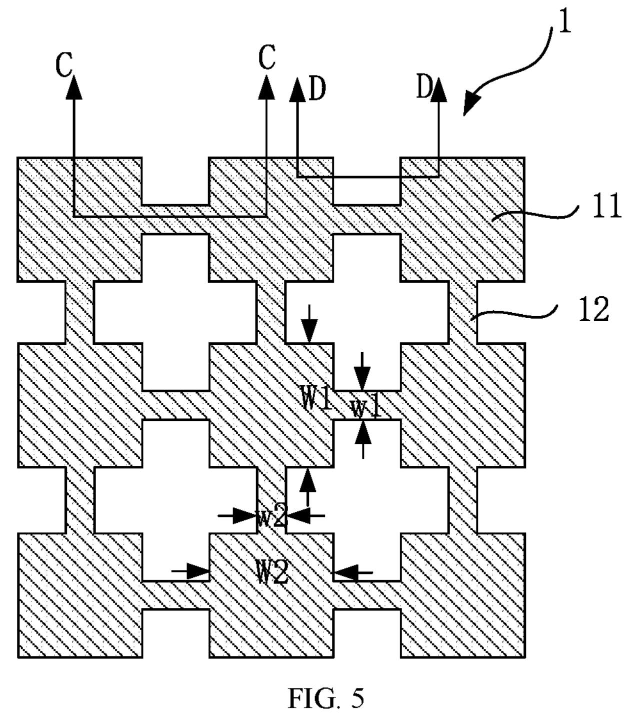
FIG. 5
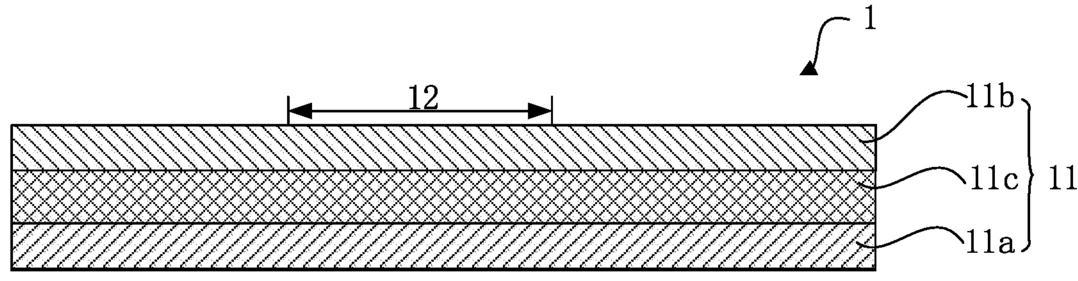
FIG. 6
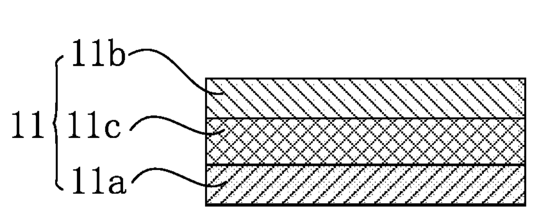
FIG. 7

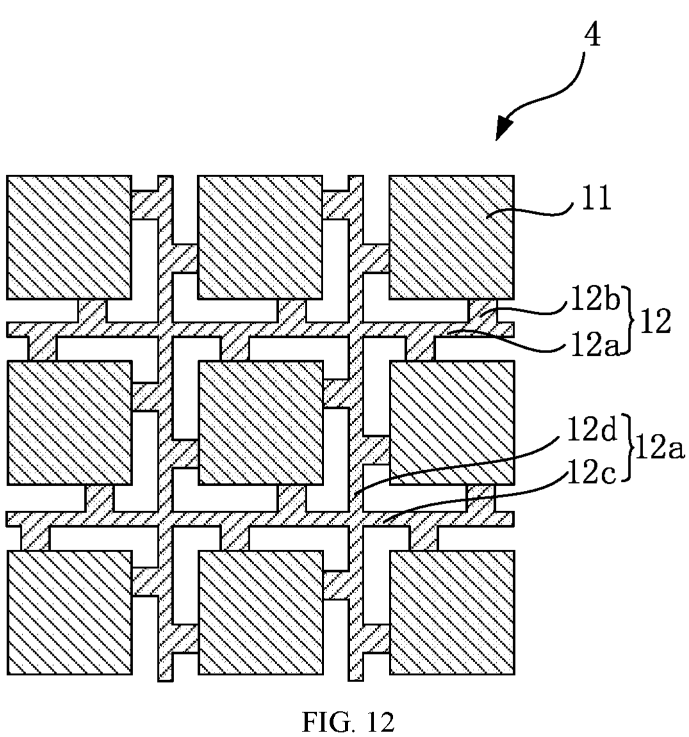
FIG. 12
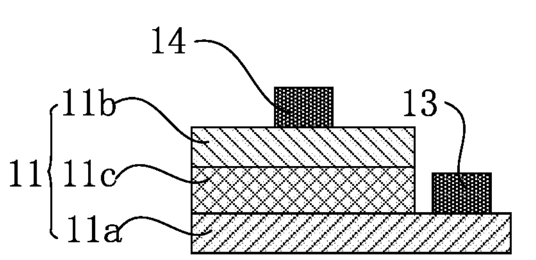
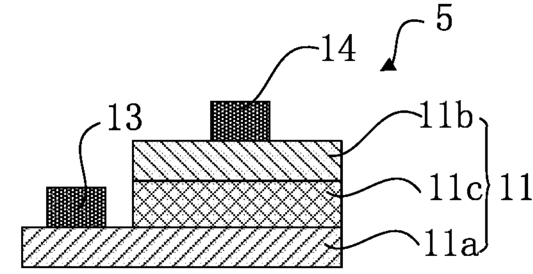
FIG. 13
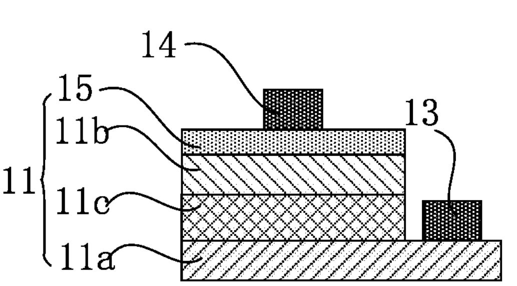
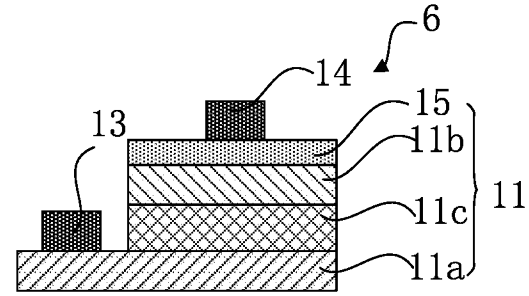
FIG. 14

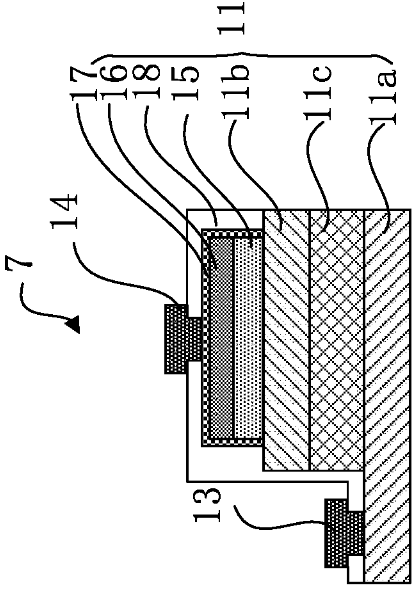
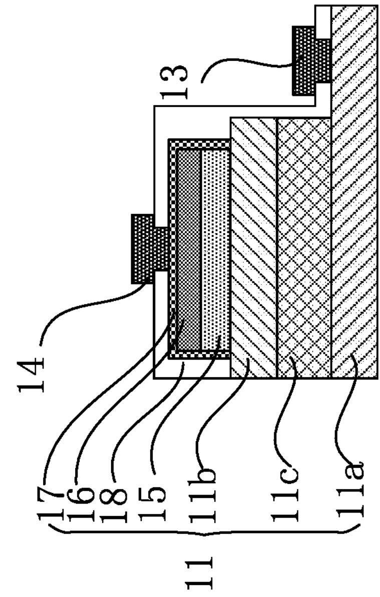
FIG. 15

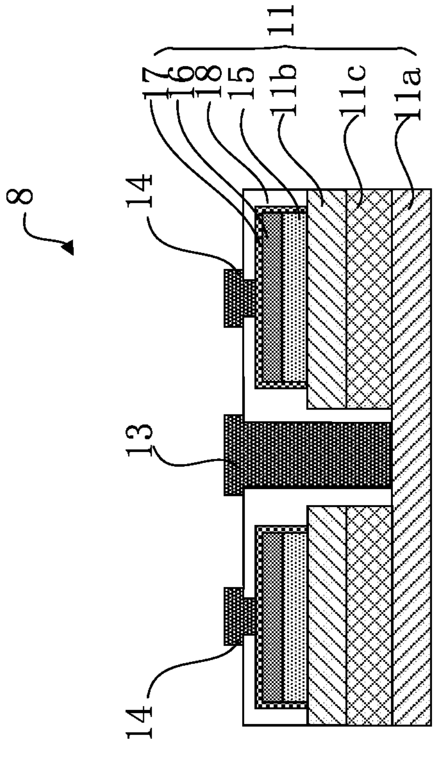
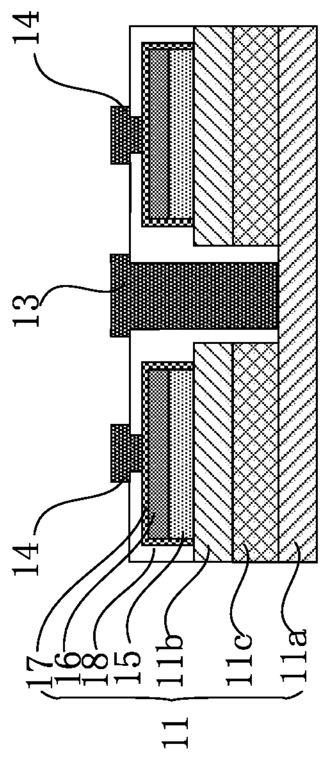
FIG. 20

SEMICONDUCTOR STRUCTURE AND MANUFACTURING METHOD THEREFOR

CROSS-REFERENCE TO RELATED APPLICATIONS

This application is a national phase entry of and claims priority to International Patent Application No. PCT/CN2020/102318 (filed 16 Jul. 2020), the entire disclosure of which is incorporated herein by reference.

TECHNICAL FIELD

The present disclosure relates to the field of semiconductor technologies, and in particular, to a semiconductor structure and a method for manufacturing the semiconductor structure.

BACKGROUND

A group III nitride semiconductor material has the advantages of large band gap (0.7 eV~6.2 eV), high carrier saturation migration rate, high breakdown electric field, and good thermal conductivity etc., such that the group III nitride semiconductor material is adapted to manufacture blue, green, and ultraviolet light emitting diodes (LEDs) as well as integrated electronic devices with high frequency, high power, and resistance to electromagnetic radiation.

The LEDs based on group III nitride semiconductor materials can be divided into horizontal and vertical structures. In the horizontal structure, a P electrode and a N electrode are disposed on the same side of the light emitting structure, and the conduction current flows in the horizontal direction (perpendicular to a thickness direction of the LED). In the vertical structure, the P electrode and the N electrode are disposed on two sides of the light emitting structure respectively, and the conduction current flows in the vertical direction (the thickness direction of the LED). The horizontal structure of the LED can be divided into a normal structure and a flip structure. In the normal structure, the P electrode is disposed on the light emitting path of the light emitting structure. In the flip structure, the P electrode and the N electrode are not disposed on the light emitting path of the light emitting structure.

The methods for manufacturing the LED in the related art are adapted to large-size chip categories and application markets, and are not adapted to small-size chips, resulting in low manufacturing efficiency of LED chips with mini-class (50 μm~100 μm) and micro-class (<50 μm).

In view of this, it is necessary to provide a semiconductor structure and a manufacturing method thereof to improve the manufacturing efficiency of small-size LED chips.

SUMMARY

An aspect of the present disclosure provides a semiconductor structure to achieve the above purpose, the semiconductor structure includes:

- light emitting units arranged in an array, where adjacent light emitting units of the light emitting units are connected together by a connection post; a width, in a lateral direction of the array, of the connection post is smaller than a width, in the lateral direction of the array, of each of the light emitting units; and a width, in a longitudinal direction of the array, of the connection post is smaller than a width, in the longitudinal direction of the array, of each of the light emitting units.

In some embodiments, the connection post includes a backbone and a branch, the backbone includes at least one of a first backbone extending in the lateral direction or a second backbone extending in the longitudinal direction, and the branch is connected with the first backbone and the light emitting unit or is connected with the second backbone and the light emitting unit.

In some embodiments, for each of the light emitting units, the light emitting unit includes an N-type semiconductor layer, a P-type semiconductor layer and a light emitting layer between the N-type semiconductor layer and the P-type semiconductor layer, and the connection post is disposed in the same layer as the N-type semiconductor layer or the connection post is disposed in the same layer as the P-type semiconductor layer.

In some embodiments, the light emitting unit further includes a P electrode and an N electrode, the P electrode is electrically connected to the P-type semiconductor layer and the N electrode is electrically connected to the N-type semiconductor layer.

In some embodiments, the P electrode is disposed on a side of the P-type semiconductor layer away from the light emitting layer, and the N electrode is disposed on a side of the N-type semiconductor layer away from the light emitting layer.

In some embodiments, the P electrode and the N electrode are both disposed on the side of the P-type semiconductor layer away from the light emitting layer.

In some embodiments, the P electrode and the N electrode are both disposed on the side of the N-type semiconductor layer away from the light emitting layer.

In some embodiments, the light emitting unit further includes a current diffusion layer, the current diffusion layer is disposed on a side of the P-type semiconductor layer away from the light emitting layer.

In some embodiments, the light emitting unit further includes a light reflecting layer, the light reflecting layer is disposed on a side of the N-type semiconductor layer away from the light emitting layer or on a side of the P-type semiconductor layer away from the light emitting layer.

In some embodiments, a material of the light emitting layer includes a single quantum well material or a multiple quantum well material.

In some embodiments, the light emitting unit includes one or more light emitting subunits.

In some embodiments, a material of the light emitting unit includes a group III nitride material.

Another aspect of the present disclosure provides a method for manufacturing a semiconductor structure, including:

providing a substrate on which a first conductive type semiconductor layer, a light emitting layer and a second conductive type semiconductor layer are sequentially formed, where the first conductive type is one of a N-type and a P-type and the second conductive type is the other of the N-type and the P-type;

removing the second conductive type semiconductor layer, the light emitting layer and the first conductive type semiconductor layer in first predetermined regions to form grooves, and retaining the second conductive type semiconductor layer, the light emitting layer and the first conductive type semiconductor layer in second predetermined regions and third predetermined regions, where the second conductive type semiconductor layer, the light emitting layer and the first conductive type semiconductor layer in the second predetermined regions form light emitting units arranged in an array, and the second conductive type semiconductor layer, the light emitting layer and the first conductive type semiconductor layer in the third predetermined regions form connection posts, each of which connects adjacent light emitting units of the light emitting units; a width, in a lateral direction of the array, of each of the third predetermined regions is smaller than a width, in the lateral direction of the array, of each of the second predetermined regions; and a width, in a longitudinal direction of the array, of each of the third predetermined regions is smaller than a width, in the longitudinal direction of the array, of each of the second predetermined regions; and removing the substrate by wet etching from the grooves, where an etching solution used in the wet etching removes the substrate at a greater rate in a horizontal plane direction than in a thickness direction.

In some embodiments, for each of the third predetermined regions, the third predetermined region includes a backbone region and a branch region, the backbone region includes at least one of a first backbone region extending in the lateral direction or a second backbone region extending in the longitudinal direction, and the branch region is connected with the first backbone region and the second predetermined region or is connected with the second backbone region and the second predetermined region.

In some embodiments, when removing the second conductive type semiconductor layer, the light emitting layer and the first conductive type semiconductor layer in the first predetermined regions, the second conductive type semiconductor layer and the light emitting layer in the third predetermined regions are further removed, and the first conductive type semiconductor layer in the third predetermined regions is retained to form the connection posts.

In some embodiments, after forming the first conductive type semiconductor layer, the light emitting layer and the second conductive type semiconductor layer and before removing the second conductive type semiconductor layer, the light emitting layer and the first conductive type semiconductor layer in the first predetermined regions to form the grooves, the method further includes: for each of the first predetermined regions, removing the second conductive type semiconductor layer and the light emitting layer in a part of the first predetermined region to expose a part of the first conductive type semiconductor layer; and forming a first electrode on the exposed part of the first conductive type semiconductor layer and forming a second electrode on the second conductive type semiconductor layer.

In some embodiments, after removing the second conductive type semiconductor layer, the light emitting layer and the first conductive type semiconductor layer in the first predetermined regions to form the grooves and before removing the substrate by wet etching, the method further includes: for each of the first predetermined regions, removing the second conductive type semiconductor layer and the light emitting layer in a part of the first predetermined region to expose a part of the first conductive type semiconductor layer; and forming a first electrode on the exposed part of the first conductive type semiconductor layer and forming a second electrode on the second conductive type semiconductor layer.

In some embodiments, in response to determining that the first conductive type semiconductor layer is a P-type semiconductor layer, before forming the first electrode, a current diffusion layer is formed on the exposed part of the first conductive type semiconductor layer; in response to determining that the second conductive type semiconductor layer is a P-type semiconductor layer, before forming the second electrode, a current diffusion layer is formed on the second conductive type semiconductor layer.

In some embodiments, a light reflecting layer is formed on the substrate before the first conductive type semiconductor layer is formed; or a light reflecting layer is further formed after the second conductive type semiconductor layer is formed.

In some embodiments, a material of the light emitting layer includes a single quantum well material or a multiple quantum well material.

In some embodiments, the light emitting unit includes one or more light emitting subunits.

In some embodiments, at least one of a material of the first conductive type semiconductor layer, a material of the light emitting layer, or a material of the second conductive type semiconductor layer includes a group III nitride material.

In some embodiments, a material of the substrate includes single crystal silicon, and the etching solution includes a mixture of hydrofluoric acid, nitric acid, and acetic acid.

Compared with the related art, the present disclosure has the following beneficial effects.

1) In the method for manufacturing the semiconductor structure of the present disclosure, for the substrate, the first conductive type semiconductor layer, the light emitting layer and the second conductive type semiconductor layer distributed sequentially from bottom to top, the second conductive type semiconductor layer, the light emitting layer and the first conductive type semiconductor layer in the first predetermined regions are removed to form the grooves, and the second conductive type semiconductor layer, the light emitting layer and the first conductive type semiconductor layer in the second predetermined regions and the third predetermined regions are retained. The second conductive type semiconductor layer, the light emitting layer and the first conductive type semiconductor layer in the second predetermined regions form light emitting units arranged in an array. The second conductive type semiconductor layer, the light emitting layer and the first conductive type semiconductor layer in the third predetermined regions form connection posts, each of which connects adjacent light emitting units. A width, in a lateral direction of the array, of the third predetermined region is smaller than a width, in the lateral direction of the array, of the second predetermined region. A width, in a longitudinal direction of the array, of the third predetermined region is smaller than a width, in the longitudinal direction of the array, of the second predetermined region. In this way, a plurality of small-sized LED structures can be formed in large quantities by removing the substrate from the grooves with wet etching.
2) In an embodiment, when the second conductive type semiconductor layer, the light emitting layer and the first conductive type semiconductor layer in the first predetermined regions are removed, the second conductive type semiconductor layer and the light emitting layer in the third predetermined regions are also removed, and the first conductive type semiconductor layer in the third predetermined regions is retained to form the connection posts. The connection post has a thin thickness to facilitate subsequent cutting, so as to form individual discrete LED structures.
3) In an embodiment, the third predetermined region includes a backbone region and a branch region, the backbone region includes at least one of a first backbone region extending in the lateral direction or a second backbone region extending in the longitudinal direction, and the branch region is connected with the first backbone region and the second predetermined region or is connected with the second backbone region and the second predetermined region. The backbone region is conducive to identifying the arrangement of the light emitting units, and can improve the uniformity of force between the light emitting units.

4) In an embodiment, after the first conductive type semiconductor layer, the light emitting layer and the second conductive type semiconductor layer are formed, and before the second conductive type semiconductor layer, the light emitting layer and the first conductive type semiconductor layer in the first predetermined regions are removed to form the grooves, the method further includes: for each of the first predetermined regions, removing the second conductive type semiconductor layer and the light emitting layer in a part of the second predetermined regions to expose a part of the first conductive type semiconductor layer; and forming a first electrode on the exposed part of the first conductive type semiconductor layer and forming a second electrode on the second conductive type semiconductor layer. The present embodiment allows the formation of several normal or flip LED structures in large quantities at once.

5) In an embodiment, after the second conductive type semiconductor layer, the light emitting layer and the first conductive type semiconductor layer in the first predetermined regions are removed to form the grooves and before the substrate is removed by wet etching, the method further includes: for each of the first predetermined regions, removing the second conductive type semiconductor layer and the light emitting layer in a part of the second predetermined region to expose a part of the first conductive type semiconductor layer; and forming a first electrode on the exposed part of the first conductive type semiconductor layer and forming a second electrode on the second conductive type semiconductor layer. This embodiment also allows the formation of several normal or flip LED structures in large quantities at once.

BRIEF DESCRIPTION OF THE DRAWINGS

FIG. 1 is a flowchart illustrating a method for manufacturing a semiconductor structure according to a first embodiment of the present disclosure.

FIGS. 2 to 4 are schematic diagrams of intermediate structures corresponding to the process in FIG. 1.

FIG. 5 is a top view of the semiconductor structure of the first embodiment of the present disclosure.

FIG. 6 is a sectional view along line CC in FIG. 5.

FIG. 7 is a sectional view along line DD in FIG. 5.

FIG. 12 is a top view of a semiconductor structure of a fourth embodiment of the present disclosure.

FIG. 13 is a sectional view of a semiconductor structure of a fifth embodiment of the present disclosure.

FIG. 14 is a sectional view of a semiconductor structure of a sixth embodiment of the present disclosure.

FIG. 15 is a sectional view of a semiconductor structure of a seventh embodiment of the present disclosure.

FIG. 20 is a sectional view of a semiconductor structure of an eighth embodiment of the present disclosure.

Figure 3:
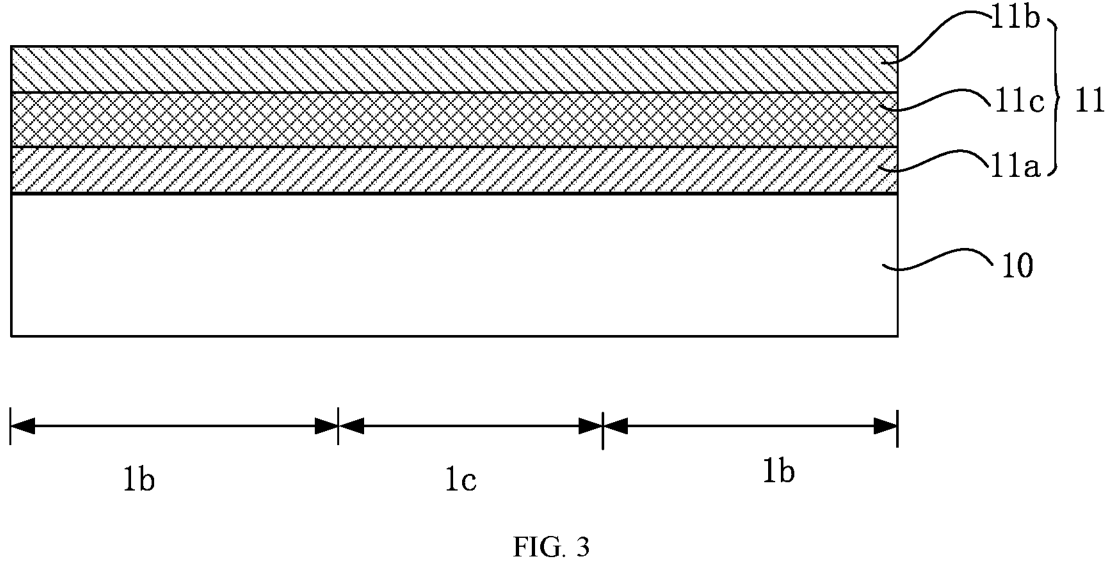

For the convenience of understanding of the present disclosure, all reference numerals appearing in the present disclosure are listed below:

semiconductor structure 1, 2, 3, 4, 5, 6, 7, and 8;
substrate 10;
light emitting unit 11;
N-type semiconductor layer 11*a;*
P-type semiconductor layer 11*b;*
light emitting layer 11*c;*
first predetermined region 1*a;*
second predetermined region 1*b;*
third predetermined region 1*c;*
groove 1*v;*
connection post 12;
backbone 12*a;*
branch 12*b;*
first backbone 12*c;*
second backbone 12*d;*
backbone region 1*d;*
branch region 1*e;*
first backbone region 1*f;*
second backbone region 1*g;*
N electrode 13;
P electrode 14;
current diffusion layer 15;
light reflecting layer 16;
protection layer 17;
insulation layer 18.

DETAILED DESCRIPTION OF THE EMBODIMENTS

To make the forgoing objectives, features and advantages of the present disclosure clearer and more comprehensible, the following describes the specific embodiments of the present disclosure in detail with reference to the accompanying drawings.

Figure 4:
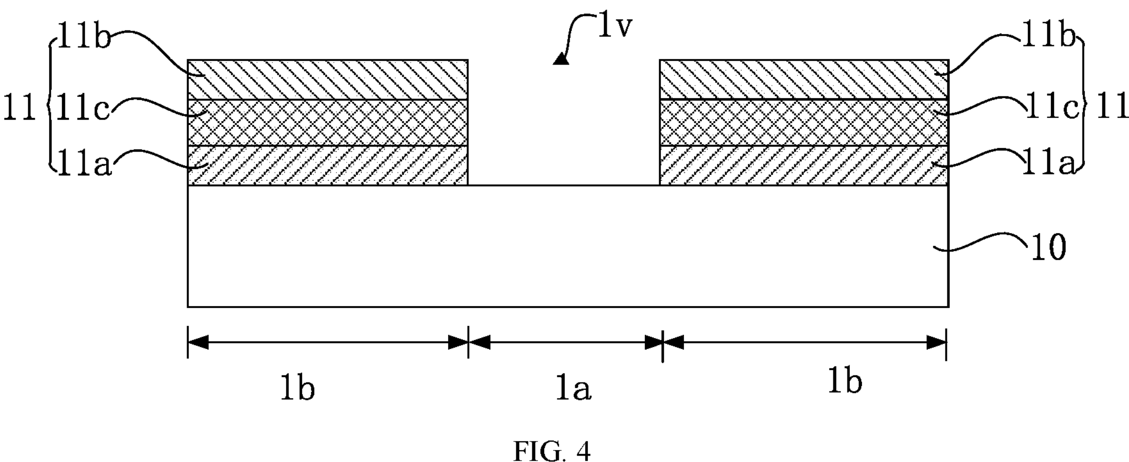

FIG. 1 is a flowchart illustrating a method for manufacturing a semiconductor structure according to a first embodiment of the present disclosure; FIGS. 2 to 4 are schematic diagrams of intermediate structures corresponding to the process in FIG. 1. FIG. 5 is a top view of the semiconductor structure of the first embodiment of the present disclosure; FIG. 6 is a sectional view along line CC in FIG. 5; FIG. 7 is a sectional view along line DD in FIG. 5.

First, referring to steps S1 in FIG. 1, FIG. 2 and FIG. 3, a substrate 10 is provided, and a first conductive type semiconductor layer, a light emitting layer 11*c* and a second conductive type semiconductor layer are formed on the substrate 10 in sequence. The first conductive type is one of a N-type and a P-type, and the second conductive type is the other of the N-type and the P-type. FIG. 3 is a sectional view along the line AA in FIG. 2.

A material of the substrate 10 may include sapphire, silicon carbide, silicon, diamond, gallium nitride (GaN), or one of sapphire, silicon carbide, silicon and diamond, and GaN thereon.

The first conductive type semiconductor layer may be an N-type semiconductor layer 11*a*, the material of which may be, for example, an N-type group III nitride material. The N-type doping element may include at least one of Si, Ge, Sn, Se, or Te. The group III nitride material may include any one or a combination of GaN, aluminum gallium nitride (AlGaN), indium gallium nitride (InGaN) and aluminum indium gallium nitride (AlInGaN).

The process for forming the N-type semiconductor layer 11*a* may include: atomic layer deposition (ALD), or chemical vapor deposition (CVD), or molecular beam epitaxy (MBE) or plasma enhanced chemical vapor deposition (PECVD), or low pressure chemical vapor deposition (LPCVD), or metal-organic chemical vapor deposition (MOCVD). MOCVD, or a combination thereof.

The N-type semiconductor layer 11*a* may include one or more layers.

The light emitting layer 11*c* may include at least one of a single quantum well structure, a multiple quantum well (MQW) structure, a quantum wire structure, or a quantum dot structure. The light emitting layer 11*c* may include a potential well layer and a potential barrier layer formed by the group III nitride material. The group III nitride material may include any one or a combination of GaN, AlGaN, InGaN and AlInGaN.

For example, the potential well layer may include an $Al_xGa_{1-x}N$ layer, where x represents a percentage of the mass of the element Al to the sum of the mass of the element Al and the mass of the element Ga, $1 \geq x \geq 0$; and/or the potential barrier layer may include an $Al_yGa_{1-y}N$ layer, where y represents a percentage of the mass of the element Al to the sum of the mass of the element Al and the mass of the element Ga, $1 \geq y \geq 0$. A band gap of the potential well layer is smaller than that of the potential barrier layer.

The process for forming the potential well layer and/or the potential barrier layer may be referred to the process for forming the N-type semiconductor layer 11*a*.

The potential well layer and/or the potential barrier layer may be doped with Al or may be undoped with Al. When the potential well layer and/or the potential barrier layer are undoped with Al, the crystalline quality can be improved, and when the potential well layer and/or the potential barrier layer are doped with Al, the resistance can be reduced.

Multiple potential well layers and multiple potential barrier layers are arranged alternately to form a multiple quantum well, such that the luminescence efficiency is further improved.

The second conducting type semiconductor layer may be a P-type semiconductor layer 11*b*, such as a P-type group III nitride material. The P-type doping element may include at least one of Mg, Zn, Ca, Sr, or Ba. The group III nitride material may include any one or a combination of GaN, AlGaN, InGaN, and AlInGaN.

The process for forming the P-type semiconductor layer 11*b* may be referred to the process for forming the N-type semiconductor layer 11*a*.

The P-type semiconductor layer 11*b* may include one or more layers.

In some embodiments, the P-type semiconductor layer 11*b* may be close to the substrate 10 and the N-type semiconductor layer 11*a* may be away from the substrate 10.

Next, referring to step S2 in FIG. 1 and FIGS. 2 to 4, the second conductive type semiconductor layer, the light emitting layer 11*c* and the first conductive type semiconductor layer in first predetermined regions 1*a* are removed to form grooves 1*v*, and the second conductive type semiconductor layer, the light emitting layer 11*c* and the first conductive type semiconductor layer in second predetermined regions 1*b* and third predetermined regions 1*c* are retained. The second conductive type semiconductor layer, the light emitting layer 11*c* and the first conductive type semiconductor layer in the second predetermined regions 1*b* form light emitting units 11 arranged in an array. The second conductive type semiconductor layer, the light emitting layer 11*c* and the first conductive type semiconductor layer in the third predetermined regions 1*c* form connection posts 12, each of which connects adjacent light emitting units 11 of the light emitting units 11. A width, in a lateral direction of the array, of each of the third predetermined regions 1*c* is smaller than a width, in the lateral direction of the array, of each of the second predetermined regions 1*b*, and a width, in a longitudinal direction of the array, of each of the third predetermined regions 1*c* is smaller than a width, in the longitudinal direction of the array, of each of the second predetermined regions 1*b*. FIG. 4 is a sectional view along line BB in FIG. 2.

In some embodiments, removing the second conductive type semiconductor layer, the light emitting layer 11*c* and the first conductive type semiconductor layer in the first predetermined regions 1*a* is achieved by dry etching. The etching gas for dry etching may include a mixture of $BCl_3$ and $Cl_2$.

In some embodiments, removing the second conductive type semiconductor layer, the light emitting layer 11*c* and the first conductive type semiconductor layer in the first predetermined regions 1*a* is achieved by wet etching. The wet etching solution may be, for example, a KOH solution, which is corrosive on an N surface, but non-corrosive on a Ga surface. Thus, the N surfaces of the second conductive type semiconductor layer, the light emitting layer 11*c* and the first conductive type semiconductor layer can be controlled by the growth process to face upward. The N surfaces of the second conductive type semiconductor layer, the light emitting layer 11*c* and the first conductive type semiconductor layer facing upward means that, using a Ga—N bond parallel to a C axis ([0001] crystal orientation) as a reference, the N atoms in each Ga—N bond are further away from the substrate 10. It will be understood that, in this case, the lower surfaces of the second conductive type semiconductor layer, the light emitting layer 11*c* and the first conductive type semiconductor layer are the Ga surfaces.

Afterwards, referring to step S3 in FIG. 1 and FIGS. 2 to 7, the substrate 10 is removed by wet etching from the grooves 1*v*. The wet etching uses an etching solution that removes the substrate 10 at a greater rate in a horizontal direction than in the thickness direction. FIG. 5 is a top view of the semiconductor structure after removing the substrate; FIG. 6 is a sectional view along line CC in FIG. 5; FIG. 7 is a sectional view along line DD in FIG. 5.

When the material of the substrate 10 is single crystal silicon, a crystal orientation in the horizontal plane may be [110] crystal orientation, and the crystal orientation in the thickness direction may be [111] crystal orientation. The etching solution may be a mixture of hydrofluoric acid, nitric acid, and acetic acid. Since the removal rate of the etching solution in the [110] crystal orientation is greater than the removal rate in the [111] crystal orientation, thus, the silicon substrate 10 can be separated from the semiconductor structure 1 without all etching, such that the rate of stripping the substrate 10 is speeds up.

For other materials of the substrate 10, such as sapphire, silicon carbide, diamond, or GaN, targeted solutions may also be used for stripping.

Referring to FIG. 5, the semiconductor structure 1 of the first embodiment of the present disclosure includes:

light emitting units 11 arranged in an array, where adjacent light emitting units 11 of the light emitting units 11 are connected together by a connection post 12, a width w1, in a lateral direction of the array, of the connection post 12 is smaller than a width W1, in the lateral direction of the array, of each of the light emitting units 11; and a width w2, in a longitudinal direction of the array, of the connection post 12 is smaller than a width W2, in the longitudinal direction of the array, of each of the light emitting units 11.

In the semiconductor structure 1, a plurality of small-size light emitting units 11 which are connected together by the connection posts 12 can be easily transferred. When the semiconductor structure 1 is in use, the individual discrete light emitting units 11 can be formed by cutting at the connection posts 12.

Figure 8:
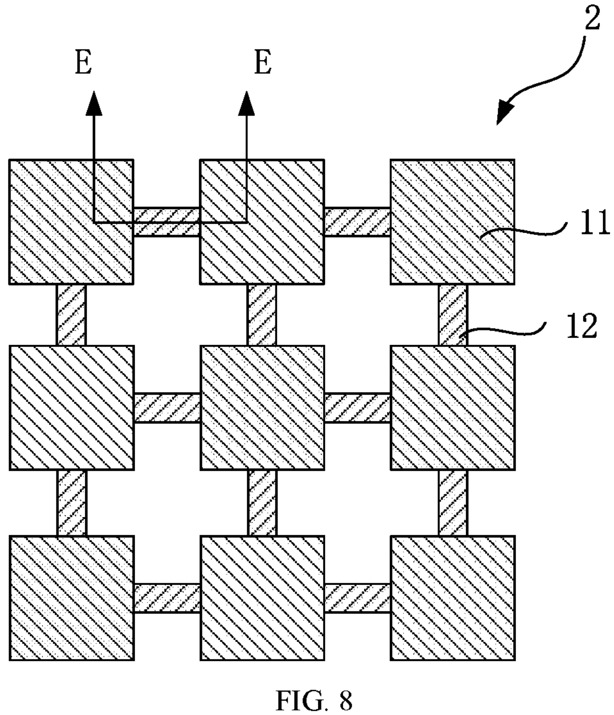
FIG. 8 is a top view of the semiconductor structure of a second embodiment of the present disclosure.
Figure 9:
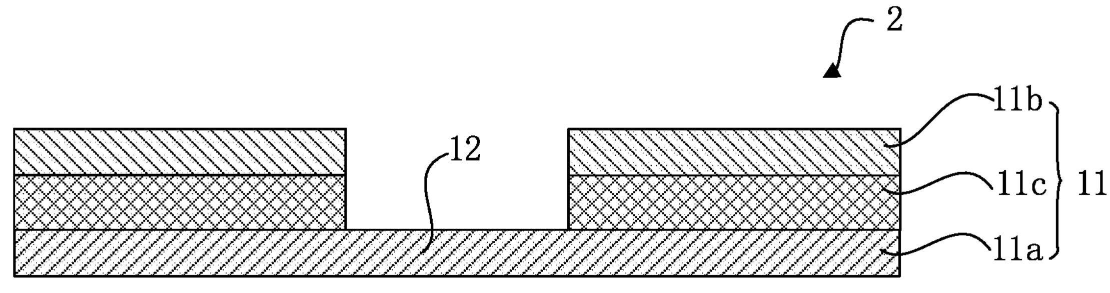
FIG. 9 is a sectional view along line EE in FIG. 8.

FIG. 8 is a top view of a semiconductor structure of a second embodiment of the present disclosure; and FIG. 9 is a sectional view along line EE in FIG. 8.

Referring to FIG. 8 and FIG. 9, the semiconductor structure 2 of the second embodiment is substantially the same as the semiconductor structure 1 of the first embodiment, the difference is only that, in the second embodiment, the connection posts 12 are located on the same layer as the first conductive type semiconductor layer.

In other words, when the N-type semiconductor layer 11*a* is close to the substrate 10, the connection posts 12 are located in the same layer as the N-type semiconductor layer 11*a*. When the P-type semiconductor layer 11*b* is close to the substrate 10, the connection posts 12 are located in the same layer as the P-type semiconductor layer 11*b*.

The connection post 12 has a thin thickness to facilitate subsequent cutting, so as to form individual discrete light emitting units 11.

Correspondingly, the method for manufacturing the semiconductor structure 2 of the second embodiment is substantially the same as the method for manufacturing the semiconductor structure 1 of the first embodiment. The difference is only that: in step S2 of the second embodiment, when removing the second conductive type semiconductor layer, the light emitting layer 11*c* and the first conductive type semiconductor layer in the first predetermined regions 1*a*, the second conductive type semiconductor layer and the light emitting layer 11*c* in the third predetermined regions 1*c* are also removed, and the first conductive type semiconductor layer in the third predetermined regions 1*c* is retained to form the connection posts 12.

Removing the second conductive type semiconductor layer, the light emitting layer 11*c* and the first conductive type semiconductor layer in the first predetermined regions 1*a* can be performed in a different process than removing the second conductive type semiconductor layer and the light emitting layer 11*c* in the third predetermined regions 1*c*. In other words, dry etching or wet etching can be performed separately using different patterns of mask layers.

Figure 10:
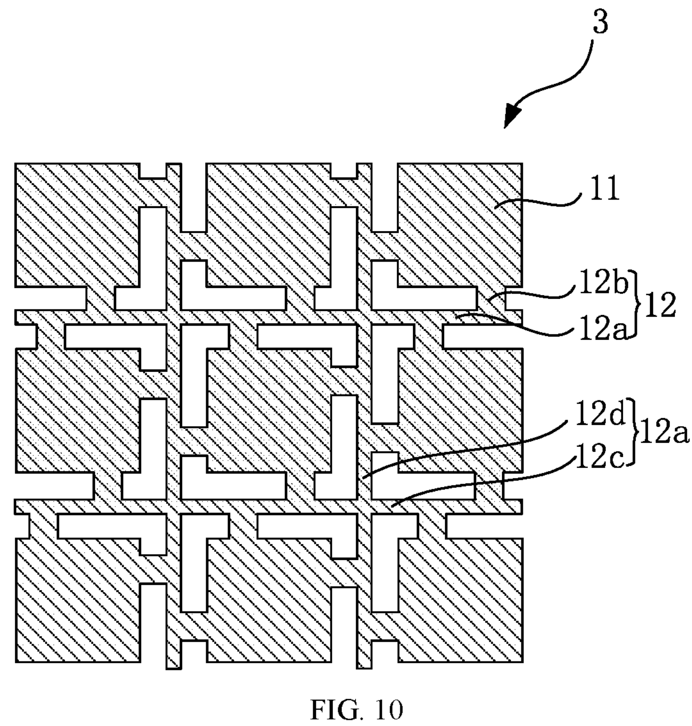
FIG. 10 is a top view of the semiconductor structure of a third embodiment of the present disclosure.
Figure 11:
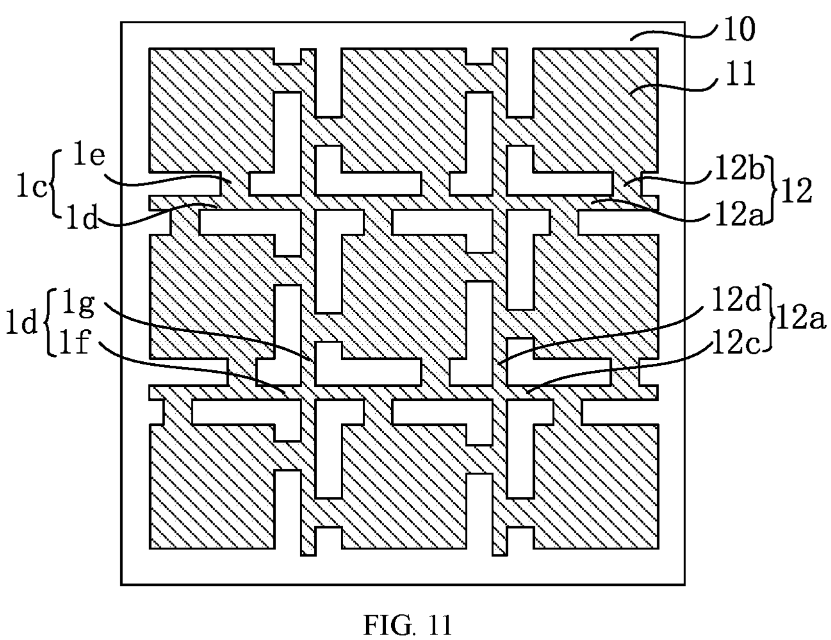
FIG. 11 is a schematic diagram of an intermediate structure corresponding to the process for manufacturing the semiconductor structure in FIG. 10.

FIG. 10 is a top view of a semiconductor structure of a third embodiment of the present disclosure. FIG. 11 is a schematic diagram of an intermediate structure corresponding to the process for manufacturing the semiconductor structure of FIG. 10.

Referring to FIG. 10, the semiconductor structure 3 of the third embodiment is substantially the same as the semiconductor structure 1 of the first embodiment, the difference is only that: in the third embodiment, the connection post 12 includes a backbone 12*a* and a branch 12*b*, the backbone 12*a* includes a first backbone 12*c* extending in the lateral direction and a second backbone 12*d* extending in the longitudinal direction, and the branch 12*b* is connected with the first backbone 12*c* and the light emitting unit 11 or is connected with the second backbone 12*d* and the light emitting unit 11.

In some embodiments, the backbone 12*a* may include a first backbone 12*c* extending in the lateral direction connecting a row of light emitting units 11 together; or the backbone 12*a* may include a second backbone 12*d* extending in the longitudinal direction connecting a column of light emitting units 11 together.

The backbone 12*a* is conducive to identifying the arrangement of the light emitting units, and can improve the uniformity of force between the light emitting units 11 in the semiconductor structure 3.

Correspondingly, referring to FIG. 11, the method for manufacturing the semiconductor structure 3 of the third embodiment is substantially the same as the methods for the semiconductor structures 1 and 2 of the first and second embodiment, the difference is only that: in step S2 of the third embodiment, the third predetermined region 1*c* includes a backbone region 1*d* and a branch region 1*e*, the backbone region 1*d* includes at least one of a first backbone region if extending in the lateral direction or a second backbone region 1*g* extending in the longitudinal direction, and the branch region 1*e* is connected with the first backbone region 1*f* and the second predetermined region 1*b* or is connected with the second backbone region 1*g* and the second predetermined region 1*b*.

FIG. 12 is a top view of a semiconductor structure of a fourth embodiment of the present disclosure.

Referring to FIG. 12, the semiconductor structure 4 of the fourth embodiment is substantially the same as the semiconductor structure 2 of the second embodiment, the difference is only that: in the fourth embodiment, the connection post 12 includes a backbone 12*a* and a branch 12*b*, the backbone 12*a* includes a first backbone 12*c* extending in the lateral direction and a second backbone 12*d* extending in the longitudinal direction, and the branch 12*b* is connected with the first backbone 12*c* and the light emitting unit 11, or is connected with the second backbone 12*d* and the light emitting unit 11.

In some embodiments, the backbone 12*a* may include a first backbone 12*c* extending in the lateral direction to connect a row of light emitting units 11 together; or the backbone 12*a* may include a second backbone 12*d* extending in the longitudinal direction to connect a column of light emitting units 11 together.

FIG. 13 is a sectional view of a semiconductor structure of a fifth embodiment of the present disclosure.

Referring to FIG. 13, the semiconductor structure 5 of this fifth embodiment is substantially the same as the semiconductor structures 1, 2, 3, and 4 of the first to fourth embodiments, the difference is only that: in the fifth embodiment, the light emitting unit 11 further includes a P electrode 14 and an N electrode 13, the P electrode 14 is electrically connected to the P-type semiconductor layer 11*b*, and the N electrode 13 is electrically connected to the N-type semiconductor layer 11*a*.

Materials of the P electrode 14 and the N electrode 13 may include metal, such as Ti/Al/Ni/Au, Ni/Au and other existing conductive materials.

An ohmic contact is formed between the P electrode 14 and the P-type semiconductor layer 11*b*, and an ohmic contact is also formed between the N electrode 13 and the N-type semiconductor layer 11*a*.

The semiconductor structure 5 is cut to form individual discrete LED structures.

Correspondingly, the method for manufacturing the semiconductor structure 5 of the fifth embodiment is substantially the same as the methods for manufacturing the semiconductor structures 1, 2, 3, and 4 of the first to fourth embodiments, the difference is only that: in the fifth embodiment, removing the second conductive type semiconductor layer and the light emitting layer 11*c* in a part of the second predetermined region 1*b* to expose a part of the first conductive type semiconductor layer, forming a first electrode on the exposed part of the first conductive type semiconductor layer, and forming a second electrode on the second conductive type semiconductor layer are performed between step S1 and step S2 or between step S2 and step S3.

When the first conductive type semiconductor layer is the N-type semiconductor layer 11*a*, the first electrode is the N electrode 13, and when the second conductive type semiconductor layer is the P-type semiconductor layer 11*b*, the second electrode is the P electrode 14.

When the first conductive type semiconductor layer is the P-type semiconductor layer 11*b*, the first electrode is the P electrode 14; and when the second conductive type semiconductor layer is the N-type semiconductor layer 11*a*, the second electrode is the N electrode 13.

The method for forming the first electrode and the second electrode may include forming a full-face metal layer by a physical vapor deposition method or a chemical vapor deposition method, and patterning the metal layer.

FIG. 14 is a sectional view of a semiconductor structure of a sixth embodiment of the present disclosure.

Referring to FIG. 14, the semiconductor structure 6 of the sixth embodiment is substantially the same as the semiconductor structures 1, 2, 3, 4, and 5 of the first to fifth embodiments, the difference is only that: the light emitting unit 11 further includes a current diffusion layer 15, which is disposed on a side of the P-type semiconductor layer 11*b* away from the light emitting layer 11*c*. The current diffusion layer 15 improves the electrical conductivity of the P-type semiconductor layer 11*b*.

A material of the current diffusion layer 15 may include indium tin oxide (ITO).

Correspondingly, the method for manufacturing the semiconductor structure 6 of the sixth embodiment is substantially the same as the method for manufacturing the semiconductor structure 5 of the fifth embodiment.

For the case where the first conductive type semiconductor layer is the N-type semiconductor layer 11*a* and the second conductive type semiconductor layer is the P-type semiconductor layer 11*b*, the method for manufacturing the semiconductor structure 6 differs from the method for manufacturing the semiconductor structure 5 only in that the current diffusion layer 15 is formed on the second conductive type semiconductor layer before the second electrode is formed.

For the case where the first conductive type semiconductor layer is the P-type semiconductor layer 11*b* and the second conductive type semiconductor layer is the N-type semiconductor layer 11*a*, the method for manufacturing the semiconductor structure 6 differs from the method for manufacturing the semiconductor structure 5 only in that the current diffusion layer 15 is formed on the exposed first conductive type semiconductor layer before the first electrode is formed.

FIG. 15 is a sectional view of a semiconductor structure of a seventh embodiment of the present disclosure. FIGS. 16 to 19 are schematic diagrams of intermediate structures corresponding to the process for manufacturing the semiconductor structure in FIG. 15.

Referring to FIG. 15, the semiconductor structure 7 of the seventh embodiment is substantially the same as the semiconductor structure 6 of the sixth embodiment, the difference is only that: a side of the current diffusion layer 15 away from the light emitting layer 11*c* is provided with a light reflecting layer 16, and the current diffusion layer 15 and the light reflecting layer 16 are encased in a protection layer 17; the protection layer 17, the upper surface of the P-type semiconductor layer 11*b* uncovered with the protection layer 17, the side walls of the P-type semiconductor layer 11*b* and the light emitting layer 11*c*, and the upper surface of the N-type semiconductor layer 11*a* are covered with an insulation layer 18; the insulation layer 18 has openings that exposes parts of the protection layer 17 on the P-type semiconductor layer 11*b* and of the N-type semiconductor layer 11*a* to form the P electrode 14 and the N electrode 13 correspondingly.

A material of the light reflecting layer 16 may include silver for reflecting light emitted from the light emitting layer 11*c* into the light emitting layer 11*c*, thereby the light is emitted out from the side of the N-type semiconductor layer 11*a*.

A material of the protection layer 17 may include titanium or copper to prevent oxidation of the silver of the light reflecting layer 16 on the one hand, and to prevent light from exiting from the side of the current-diffusing layer 15 on the other hand.

Correspondingly, the method for manufacturing the semiconductor structure 7 of the seventh embodiment is substantially the same as the method for manufacturing the semiconductor structure 6 of the sixth embodiment.

For the case where the first conductive type semiconductor layer is the N-type semiconductor layer 11*a* and the second conductive type semiconductor layer is the P-type semiconductor layer 11*b*, the method for manufacturing the semiconductor structure 7 differs from the method for manufacturing the semiconductor structure 6 only in that the steps proceeded between step S1 and step S2 or between step S2 and step S3 include: forming a light reflecting layer 16 on a side of the current diffusion layer 15 away from the light emitting layer 11*c*; forming a protection layer 17 that covers the current diffusion layer 15 and the light reflecting layer 16; forming an insulation layer 18 on the protection layer 17, the upper surface of the P-type semiconductor layer 11*b* uncovered with the protection layer 17, the side walls of the P-type semiconductor layer 11*b* and the light emitting layer 11*c*, and the upper surface of the exposed N-type semiconductor layer 11*a*; forming openings within the insulation layer 18 that expose parts of the protection layer 17 on the P-type semiconductor layer 11*b* and of the N-type semiconductor layer 11*a*; and forming a P electrode 14 and an N electrode 13 inside the openings and on the insulating layer 18 outside the openings, respectively.

Figure 16:
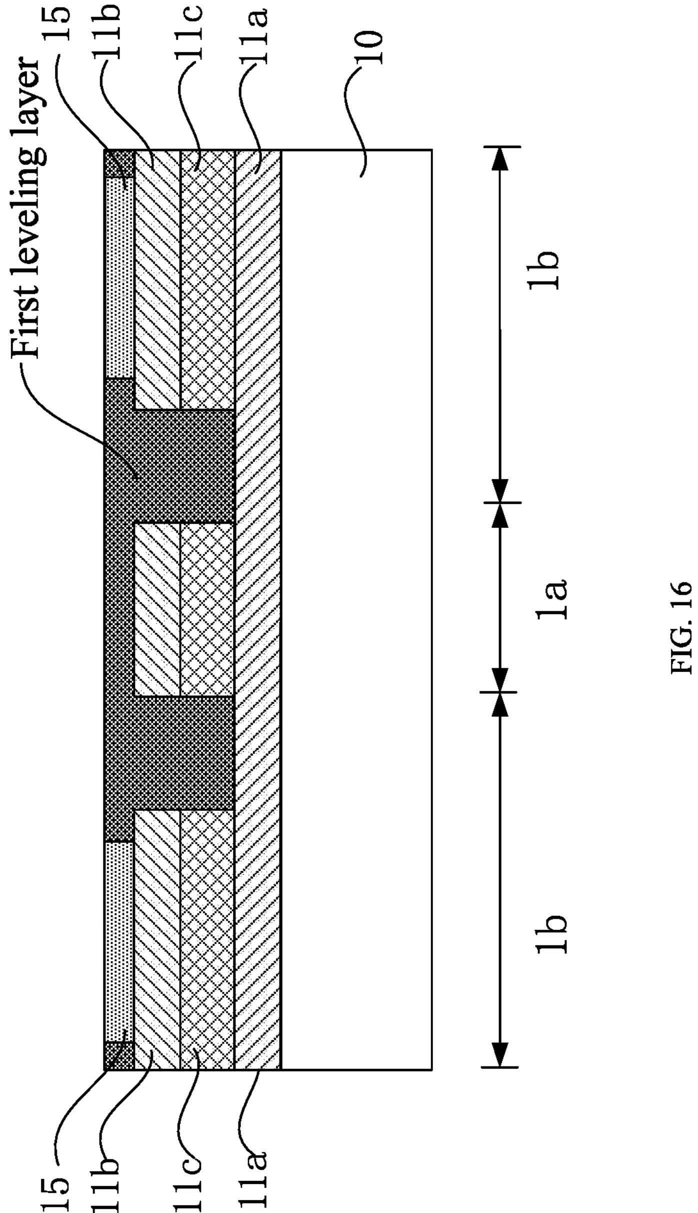
FIGS. 16 to 19 are schematic diagrams of intermediate structures corresponding to the process for manufacturing the semiconductor structure in FIG. 15.
Figure 17:
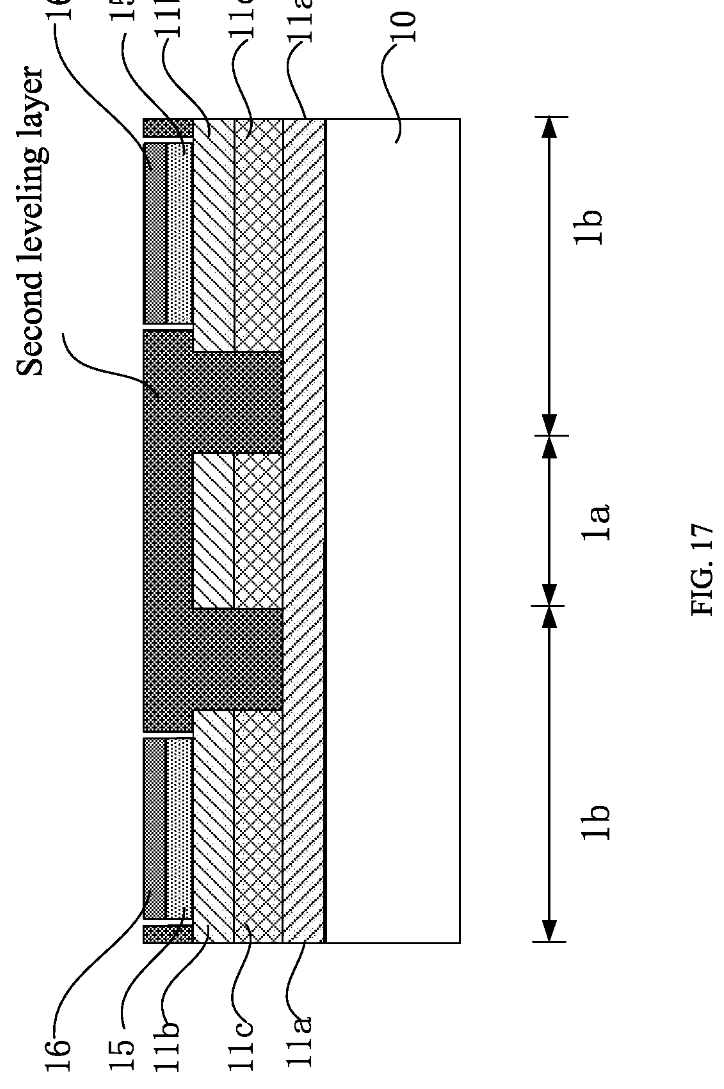
Figure 18:
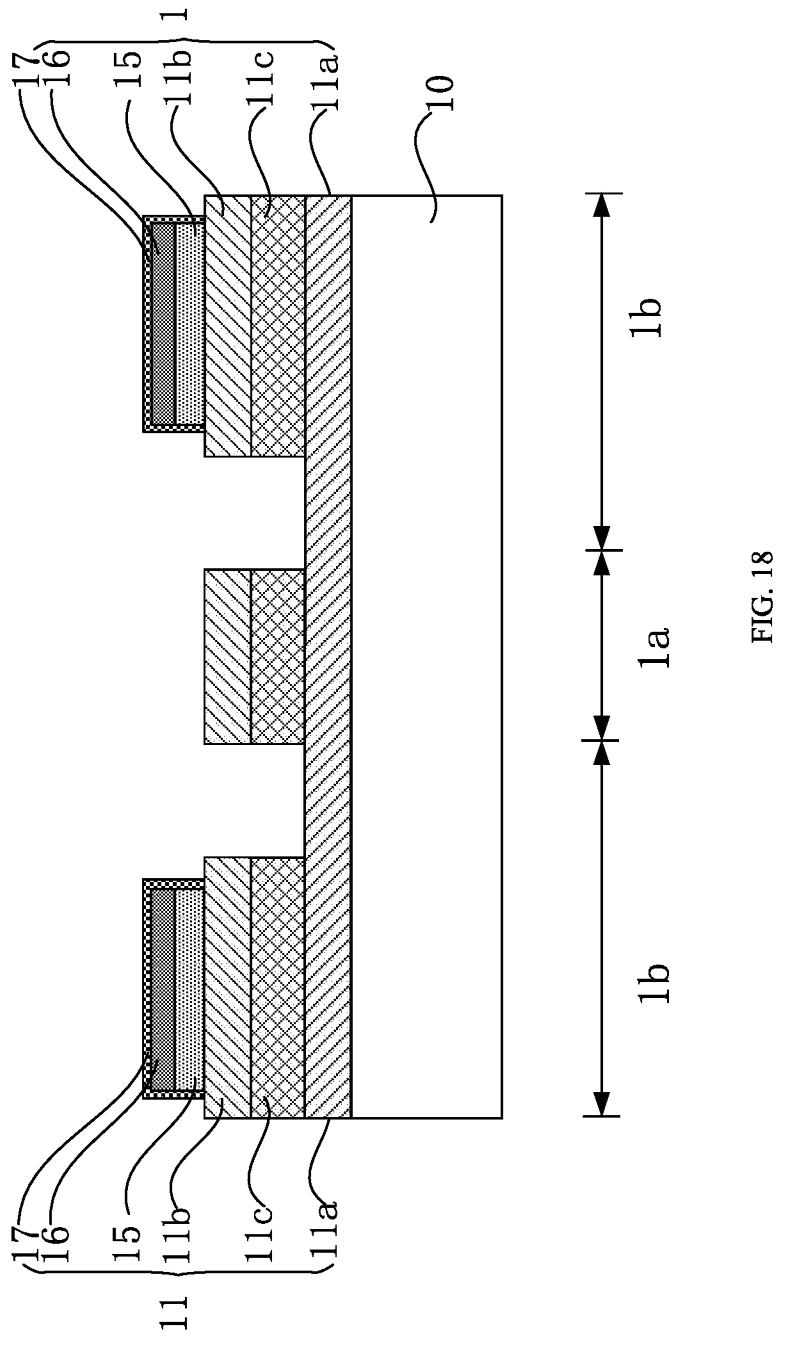

In an embodiment, the formation of the P electrode 14 and the N electrode 13 is performed between step S1 and step S2 with reference to FIGS. 16 to 18.

Specifically, referring to FIG. 16, the P-type semiconductor layer 11*b* and the light emitting layer 11*c* in a part of the second predetermined region 1*b* are first removed to expose a part of the N-type semiconductor layer 11*a*; then a current diffusion material layer is formed on the P-type semiconductor layer 11*b*, the side walls of the P-type semiconductor layer 11*b* and the light emitting layer 11*c*, and the exposed part of the N-type semiconductor layer 11*a* by a physical vapor deposition method or a chemical vapor deposition method 11*a*, and the current diffusion material layer is patterned, and the current diffusion material layer on a part of the P-type semiconductor layer 11*b* is retained to form the current diffusion layer 15; and a first leveling layer is formed on the N-type semiconductor layer 11*a*, with the upper surface of the first leveling layer flush with the upper surface of the current diffusion layer 15.

The first leveling layer may be made of an organic material with better fluid properties, such as a photoresist.

Referring to FIG. 17, a light reflecting layer 16 is formed on the upper surface of the first leveling layer and the upper surface of the current diffusion layer 15 by a sputtering method or an electroless plating method; the light reflecting layer 16 on the first leveling layer is removed together by tearing off the first leveling layer.

Continuing with reference to FIG. 17, a second leveling layer is formed on the N-type semiconductor layer 11*a*, with the upper surface of the second leveling layer flush with the upper surface of the light reflecting layer 16; the second leveling layer is patterned to form a gap between the current diffusion layer 15 and the side wall of the light reflecting layer 16. As shown in FIG. 18, a protection layer 17 is formed on the upper surface of the second leveling layer, the upper surface of the light reflecting layer 16, and the gap by a sputtering method or an electroless plating method; and the protection layer 17 on the second leveling layer is removed together by tearing off the second leveling layer.

Figure 19:
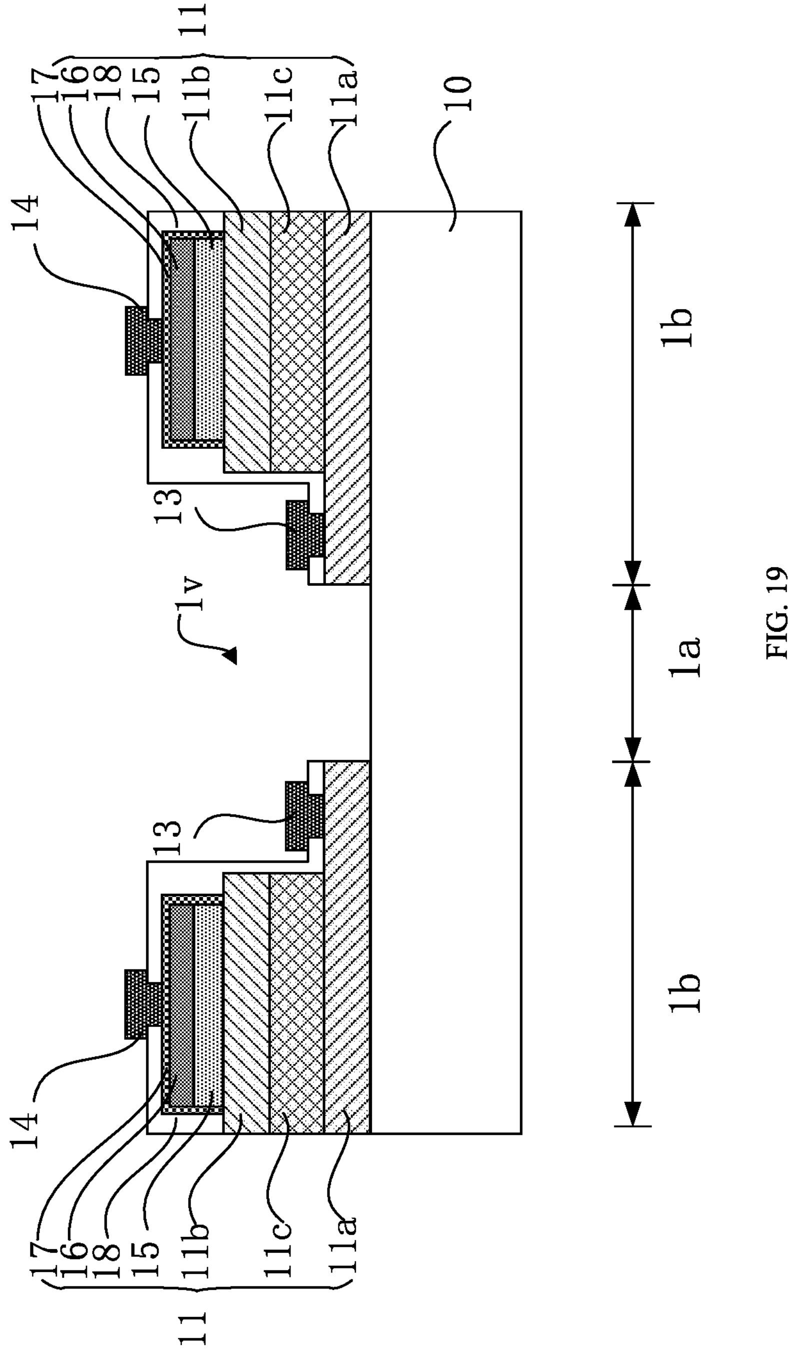

Referring to FIG. 19, an insulation layer 18 is formed on the protection layer 17, the upper surface of the P-type semiconductor layer 11*b* uncovered with the protection layer 17, the side walls of the P-type semiconductor layer 11*b* and the light emitting layer 11*c*, and the upper surface of the exposed part of the N-type semiconductor layer 11*a*. Openings are formed within the insulation layer 18 to expose parts of the protection layer 17 on the P-type semiconductor layer 11*b* and of the N-type semiconductor layer 11*a*. A P electrode 14 and an N electrode 13 are formed inside the openings and on the insulating layer 18 outside the openings, respectively. After the P electrode 14 and the N electrode 13 are formed, the P-type semiconductor layer 11*b*, the light emitting layer 11*c*, and the N-type semiconductor layer 11*a* in the first predetermined regions 1*a* can be removed to form grooves 1*v*; or after the P-type semiconductor layer 11*b*, the light emitting layer 11*c*, and the N-type semiconductor layer 11*a* in the first predetermined regions 1*a* are removed to form the grooves 1*v*, the insulation layer 18, the P electrode 14, and the N electrode 13 are formed.

For the case where the first conductive type semiconductor layer is the P-type semiconductor layer 11*b* and the second conductive type semiconductor layer is the N-type semiconductor layer 11*a*, the method for manufacturing the semiconductor structure 7 differs from the method for manufacturing the semiconductor structure 6 only in that the steps proceeded between step S1 and step S2 or between step S2 and step S3 include: forming a light reflecting layer 16 on the N-type semiconductor layer 11*a*; forming a protection layer 17 that covers the light reflecting layer 16; forming an insulation layer 18 on the protection layer 17, the N-type semiconductor layer 11*a* uncovered with the protection layer 17, the side walls of the N-type semiconductor layer 11*a* and the light emitting layer 11, the current diffusion layer 15, and the P-type semiconductor layer 11*b* without the current diffusion layer 15. Openings are formed inside the insulation layer 18 to expose parts of the protection layer 17 on the N-type semiconductor layer 11*a* and of the current diffusion layer 15 on the P-type semiconductor layer 11*b*, respectively, and the N electrode 13 and the P electrode 14 are formed inside and outside the openings of the insulating layer 18, respectively.

Figure 21:
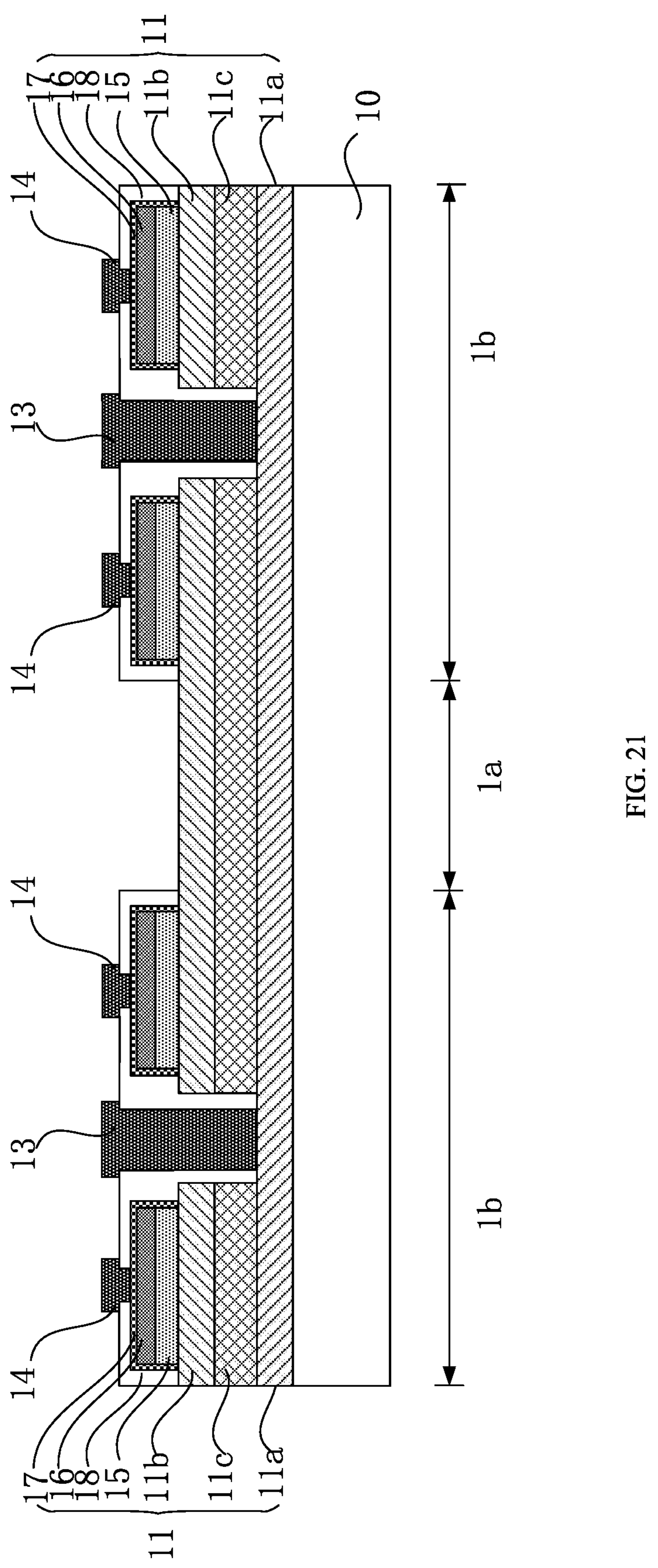
FIG. 21 is a schematic diagram of an intermediate structure corresponding to the process of manufacturing the semiconductor structure in FIG. 20.

FIG. 20 is a sectional view of a semiconductor structure of an eighth embodiment of the present disclosure; FIG. 21 is a schematic diagram of an intermediate structure corresponding to the process of manufacturing the semiconductor structure in FIG. 20.

Referring to FIG. 20 and FIG. 21, the semiconductor structure 8 of the eighth embodiment and the manufacturing method thereof are substantially the same as the semiconductor structure 7 of the seventh embodiment and the manufacturing method thereof, the difference is only that the light emitting unit 11 includes two light emitting subunits with the first electrodes on the first conductive type semiconductor layers of adjacent light emitting subunits connected together.

In some embodiments, the semiconductor structure 8 may be cut along the middle of the first electrode such that each light emitting subunit has a first electrode.

When the first conductive type semiconductor layer is an N-type semiconductor layer 11*a*, the first electrode is an N electrode 13. When the first conductive type semiconductor layer is a P-type semiconductor layer 11*b*, the first electrode is a P electrode 14.

In the semiconductor structures 5, 6, 7, and 8 of the fifth to eighth embodiments above, the first electrodes are all formed by removing parts of the second conductive type semiconductor layer and of the light emitting layer 11*c* to expose a part of the first conductive type semiconductor layer. In some embodiments, a plurality of electrically connected structures may also be formed in the first conductive type semiconductor layer to form a first electrode on a side of the second conductive type semiconductor layer away from the light emitting layer 11*c*.

In some embodiments, the first electrode may also be formed on a side of the first conductive type semiconductor layer away from the light emitting layer 11*c* after the substrate 10 is removed.

Although the present disclosure is disclosed as above, the present disclosure is not limited thereto. Any person skilled in the art may make various changes and modifications without departing from the spirit and scope of the present disclosure, and therefore the scope of the present disclosure should be subject to the scope defined by the claims.

The invention claimed is:

1. A method for manufacturing a semiconductor structure, comprising:

providing a substrate on which a first conductive type semiconductor layer, a light emitting layer and a second conductive type semiconductor layer are sequentially formed, wherein the first conductive type is one of a N-type and a P-type and the second conductive type is the other of the N-type and the P-type; wherein a material of the first conductive type semiconductor layer, a material of the light emitting layer, or a material of the second conductive type semiconductor layer comprises a group III nitride material;

removing the second conductive type semiconductor layer, the light emitting layer and the first conductive type semiconductor layer in first predetermined regions to form grooves, and retaining the second conductive type semiconductor layer, the light emitting layer and the first conductive type semiconductor layer in second predetermined regions and third predetermined regions, wherein the second conductive type semiconductor layer, the light emitting layer and the first conductive type semiconductor layer in the second predetermined regions form light emitting units arranged in an array, and the second conductive type semiconductor layer, the light emitting layer and the first conductive type semiconductor layer in the third predetermined regions form connection posts, each of the connection posts connects adjacent light emitting units of the light emitting units; a width, in a lateral direction of the array, of each of the third predetermined regions is smaller than a width, in the lateral direction of the array, of each of the second predetermined regions; and a width, in a longitudinal direction of the array, of each of the third predetermined regions is smaller than a width, in the longitudinal direction of the array, of each of the second predetermined regions; and removing the substrate by wet etching from the grooves, wherein an etching solution used in the wet etching removes the substrate at a greater rate in a horizontal plane direction than in a thickness direction.

2. The method according to claim 1, wherein for each of the third predetermined regions, the third predetermined region comprises a backbone region and a branch region, the backbone region comprises at least one of a first backbone region extending in the lateral direction or a second backbone region extending in the longitudinal direction, and the branch region is connected with the first backbone region and the second predetermined region or is connected with the second backbone region and the second predetermined region.

3. The method according to claim 1, wherein when removing the second conductive type semiconductor layer, the light emitting layer and the first conductive type semiconductor layer in the first predetermined regions, the second conductive type semiconductor layer and the light emitting layer in the third predetermined regions are further removed, and the first conductive type semiconductor layer in the third predetermined regions is retained to form the connection posts.

4. The method according to claim 1, wherein after forming the first conductive type semiconductor layer, the light emitting layer and the second conductive type semiconductor layer and before removing the second conductive type semiconductor layer, the light emitting layer and the first conductive type semiconductor layer in the first predetermined regions to form the grooves, or after removing the second conductive type semiconductor layer, the light emitting layer and the first conductive type semiconductor layer in the first predetermined regions to form the grooves and before removing the substrate by wet etching, the method further comprising:

for each of the first predetermined regions, removing the second conductive type semiconductor layer and the light emitting layer in a part of the second predetermined region to expose a part of the first conductive type semiconductor layer; and forming a first electrode on the exposed part of the first conductive type semiconductor layer and forming a second electrode on the second conductive type semiconductor layer.

5. The method according to claim 4, wherein in response to determining that the first conductive type semiconductor layer is a P-type semiconductor layer, before forming the first electrode, a current diffusion layer is formed on the exposed part of the first conductive type semiconductor layer;

in response to determining that the second conductive type semiconductor layer is a P-type semiconductor layer, before forming the second electrode, a current diffusion layer is formed on the second conductive type semiconductor layer.

6. The method according to claim 1, wherein a light reflecting layer is formed on the substrate before the first conductive type semiconductor layer is formed; or a light reflecting layer is further formed after the second conductive type semiconductor layer is formed.

7. The method according to claim 1, wherein a material of the light emitting layer comprises a single quantum well material or a multiple quantum well material.

8. The method according to claim 1, wherein the light emitting unit comprises one or more light emitting subunits.

9. The method according to claim 1, wherein a material of the substrate comprises single crystal silicon, and the etching solution comprises a mixture of hydrofluoric acid, nitric acid, and acetic acid.

10. The method according to claim 1, wherein two ends of one of the connection posts are directly connected to two of the light emitting units, and two side walls of the one of the connection posts are directly connected to two of the grooves.

* * * * *